US011296218B2

(12) United States Patent
Siemieniec et al.

(10) Patent No.: US 11,296,218 B2
(45) Date of Patent: Apr. 5, 2022

(54) SEMICONDUCTOR DEVICE

(71) Applicant: Infineon Technologies Austria AG, Villach (AT)

(72) Inventors: Ralf Siemieniec, Villach (AT); Adam Amali, Chandler, AZ (US); Michael Hutzler, Villach (AT); Laszlo Juhasz, Villach (AT); David Laforet, Villach (AT); Cedric Ouvrard, Munich (DE); Li Juin Yip, Villach (AT)

(73) Assignees: Infineon Technologies Austria AG, Villach (AT); Infineon Technologies Americas Corp., El Segundo, CA (US)

( * ) Notice: Subject to any disclaimer, the term of this patent is extended or adjusted under 35 U.S.C. 154(b) by 147 days.

(21) Appl. No.: 15/930,806

(22) Filed: May 13, 2020

(65) Prior Publication Data
US 2020/0365724 A1 Nov. 19, 2020

(30) Foreign Application Priority Data

May 15, 2019 (EP) .................................... 19174732

(51) Int. Cl.
 *H01L 29/78* (2006.01)
 *H01L 29/40* (2006.01)
 (Continued)

(52) U.S. Cl.
 CPC ...... *H01L 29/7813* (2013.01); *H01L 29/0657* (2013.01); *H01L 29/402* (2013.01); *H01L 29/42376* (2013.01); *H01L 29/7811* (2013.01)

(58) Field of Classification Search
None
See application file for complete search history.

(56) References Cited

U.S. PATENT DOCUMENTS 10,510,846 B2 * 12/2019 Siemieniec ......... H01L 29/7813
2017/0250255 A1 8/2017 Siemieniec et al.
(Continued)

FOREIGN PATENT DOCUMENTS

DE 102014112371 A1 3/2016
DE 102017114681 A1 1/2019
(Continued)

*Primary Examiner* — Robert K Carpenter
(74) *Attorney, Agent, or Firm* — Murphy, Bilak & Homiller, PLLC

(57) ABSTRACT

A semiconductor device includes a semiconductor body having first and second opposing surfaces, an active area including active transistor cells, and an edge termination region laterally surrounding the active area. Each active transistor cell includes a mesa and a columnar trench having a field plate. The edge termination region includes inactive cells each including a columnar termination trench having a field plate, and a termination mesa including a drift region of a first conductivity type. The edge termination region includes a transition region laterally surrounding the active region and an outer termination region laterally surrounding the transition region. In the transition region, the termination mesa includes a body region of a second conductivity type arranged on the drift region. In the outer termination region, the drift region extends to the first surface. A buried doped region of the edge termination region is positioned in the transition and outer termination regions.

20 Claims, 5 Drawing Sheets

(51) Int. Cl.
*H01L 29/06* (2006.01)
*H01L 29/423* (2006.01)

(56) References Cited

U.S. PATENT DOCUMENTS

2017/0250256 A1   8/2017   Siemieniec et al.
2017/0263718 A1   9/2017   West et al.

FOREIGN PATENT DOCUMENTS

WO   2008084278 A1   7/2008
WO   2015098237 A1   7/2015

* cited by examiner

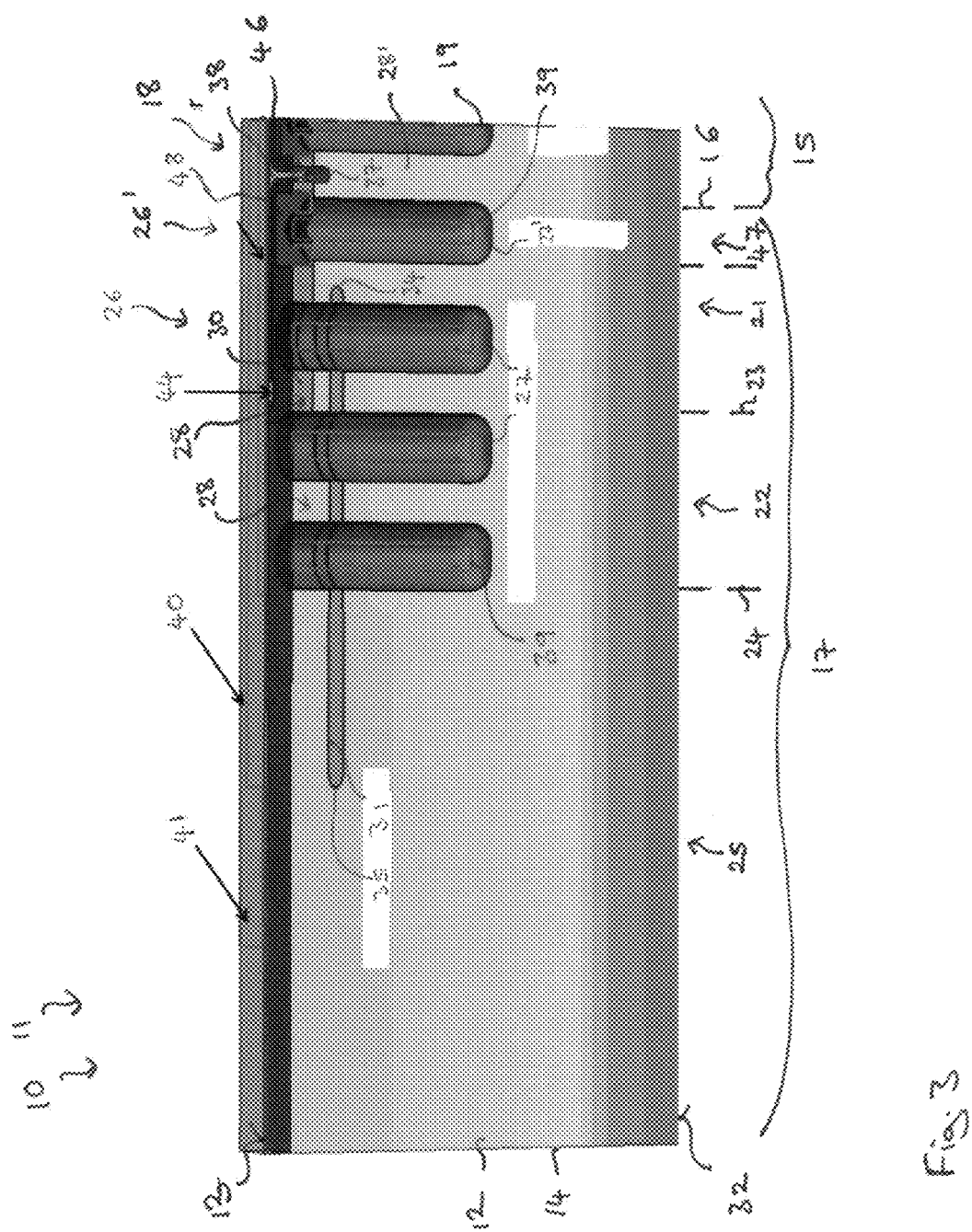

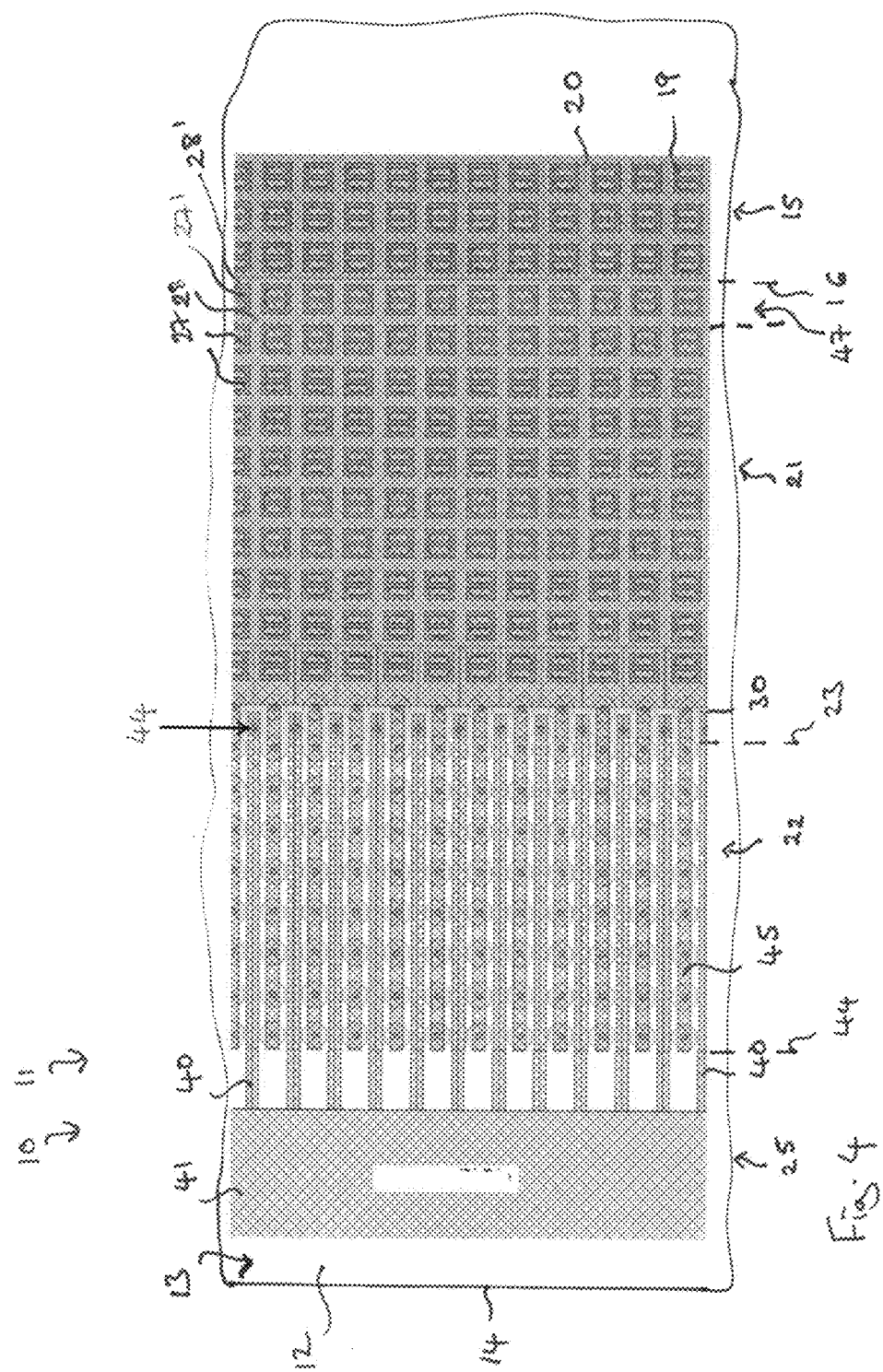

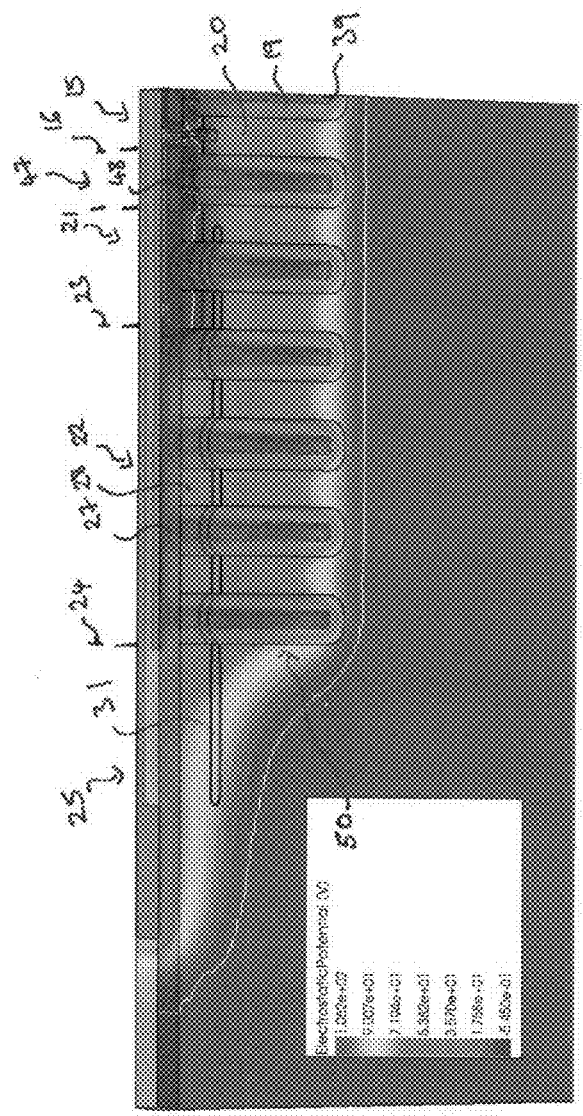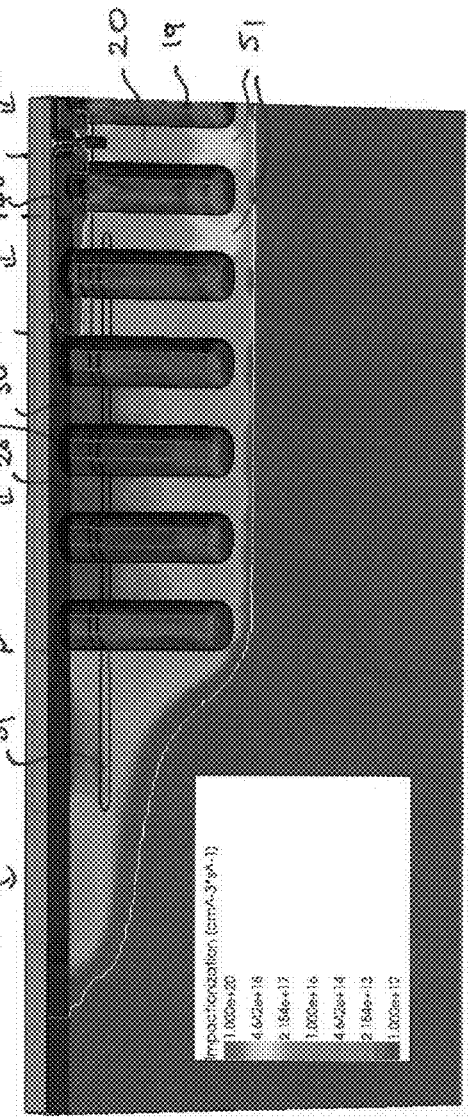

SEMICONDUCTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs).

A transistor device for power applications may be based on the charge compensation principle and may include an active cell field including a plurality of trenches, each including a field plate for charge compensation. In some designs, the trenches and mesas that are formed between adjacent trenches may each have an elongate striped structure. In some other designs, the trenches have a columnar needle-like shape, as for example disclosed in DE 10 2014 112371 A1.

Typically, the active cell field of the transistor device is laterally surrounded by an edge termination structure which serves to avoid breakdown of the semiconductor device due to edge effects. DE 10 2017 114 681 A1 discloses an arrangement of an edge termination region in which surface charging in the edge region is reduced by using a local doped region at the surface in order to improve the blocking capability of the edge termination structure.

However, further improvements would be desirable to allow higher doping in the mesas in the active cell area which in turn leads to a reduction of the RDSON of the transistor device and to reduce the risk that avalanche generation moves to the surface at the outer edge of the termination structure.

SUMMARY

In some embodiments, a semiconductor device is provided that comprises a semiconductor body having a first surface, a second surface opposing the first surface and side faces, an active area and an edge termination region laterally surrounding the active area. The active area comprises a plurality of active transistor cells. Each active transistor cell comprises a columnar trench comprising a field plate and a mesa comprising a drift region of a first conductivity type. The edge termination region comprises a plurality of inactive cells, each inactive cell comprising a columnar termination trench comprising a field plate and a termination mesa comprising a drift region of a first conductivity type. The edge termination region comprises a transition region laterally surrounding the active region and an outer termination region laterally surrounding the transition region. In the transition region, the termination mesa comprises a body region of the second conductivity type that is arranged on the drift region. In the outer termination region, the drift region of the termination mesa extends to the first surface. The edge termination region further comprises a buried doped region that has a lateral extent such that it is positioned in the transition region and in the outer termination region.

The semiconductor device may provide a transistor device, such as a vertical transistor device, for example a vertical MOSFET (Metal Oxide Semiconductor Field Effect Transistor) device.

In some embodiments, the buried doped region comprises an inner edge that is positioned under the body region in the transition region.

In some embodiments, the edge termination region further comprises an outer region that is free of inactive cells and that laterally surrounds the outer termination region.

In some embodiments, the buried doped region has an outer edge that is positioned in the outer region.

In some embodiments, the outer edge of the buried doped region is positioned laterally between the side face of the semiconductor body and the plurality of inactive cells.

In some embodiments, the buried doped region has the second conductivity type.

In some embodiments, the buried doped region is fully depletable.

In some embodiments, in the transition region, the buried doped region is vertically spaced apart from the body region of the termination mesa by a portion of the drift region.

In some embodiments, the columnar trenches have a base positioned at a depth d from the first surface and the buried doped region is positioned at a depth $d_{buried}$ from the first surface, wherein $0.6 \ \mu m \leq d_{buried} \leq 2 \ \mu m$.

In some embodiments, in the transition region the body region of the termination mesas extends to the first In these embodiments, the termination mesas in the transition region do not include a source region.

In some embodiments, the buried doped region forms a portion of side walls of at least two rows of columnar termination trenches.

In some embodiments, each mesa of the active transistor cells comprises a drift region of a first conductivity type, a body region of a second conductivity type opposing the first conductivity type arranged on the drift region, a source region of the first conductivity type arranged on the body region and a gate trench comprising a gate electrode, wherein the gate trench extends through the source region and the body region into the drift region. Each of the columnar trenches extends from the first surface through the body region and into the drift region.

The gate electrode is insulted from the mesa by an insulating layer that lines the sidewalls and base of the gate trench. The field plate in the columnar trenches is also electrically insulated from the drift region of the mesas of the active transistor cells by an insulating layer that lines the sidewalk and base of the columnar trench. The field plate also has a columnar structure. The columnar trenches have a greater height that the gate trenches and, therefore, extend to a greater depth from the first surface into the semiconductor body.

The gate trenches of each active transistor cell may be connected to one another active transistor cells to form a grid like pattern that is positioned between the columnar trenches. A gate trench may be arranged between neighbouring trenches such that the grid surrounds each of the columnar trenches. In some embodiments, the grid-like pattern is interrupted or partially interrupted.

In some embodiments, the gate trenches have a strip or stripe form.

In some embodiments, the semiconductor device further comprises at least one gate finger extending on the first surface of the semiconductor body. The at least one gate finger may extend from the active area over the edge termination region to a gate runner that is positioned laterally between the side face of the semiconductor body and the columnar termination trenches of the outer termination region.

In some embodiments, the gate runner is positioned laterally between and laterally spaced apart from the side face of the semiconductor body and the outer edge of the buried doped region.

In some embodiments, the semiconductor device further comprises a to contact extending from the gate finger to gate electrodes of the active transistor cells, wherein the gate contact and a portion of the gate runner is positioned above the body region of the termination mesas arranged in the transition region.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 3 illustrates a cross-sectional view of a portion of a semiconductor device.

FIG. 4 illustrates a plan view of a portion of a semiconductor device.

FIG. 5 illustrates the electrostatic potential simulated for the structure illustrated in FIG. 3.

FIG. 6 illustrates the impact ionization simulated for the structure illustrated in FIG. 3.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure (s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor body. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor body.

As employed in this specification, when an element such as a layer, region or substrate is referred to as being "on" or as extending "onto" another element, it can be directly on or extend directly onto the other element or intervening elements may also be present in contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present in contrast, when an element is referred to as being "directly connected" or "directly coupled" to another element, there are no intervening elements present.

Figure 1:
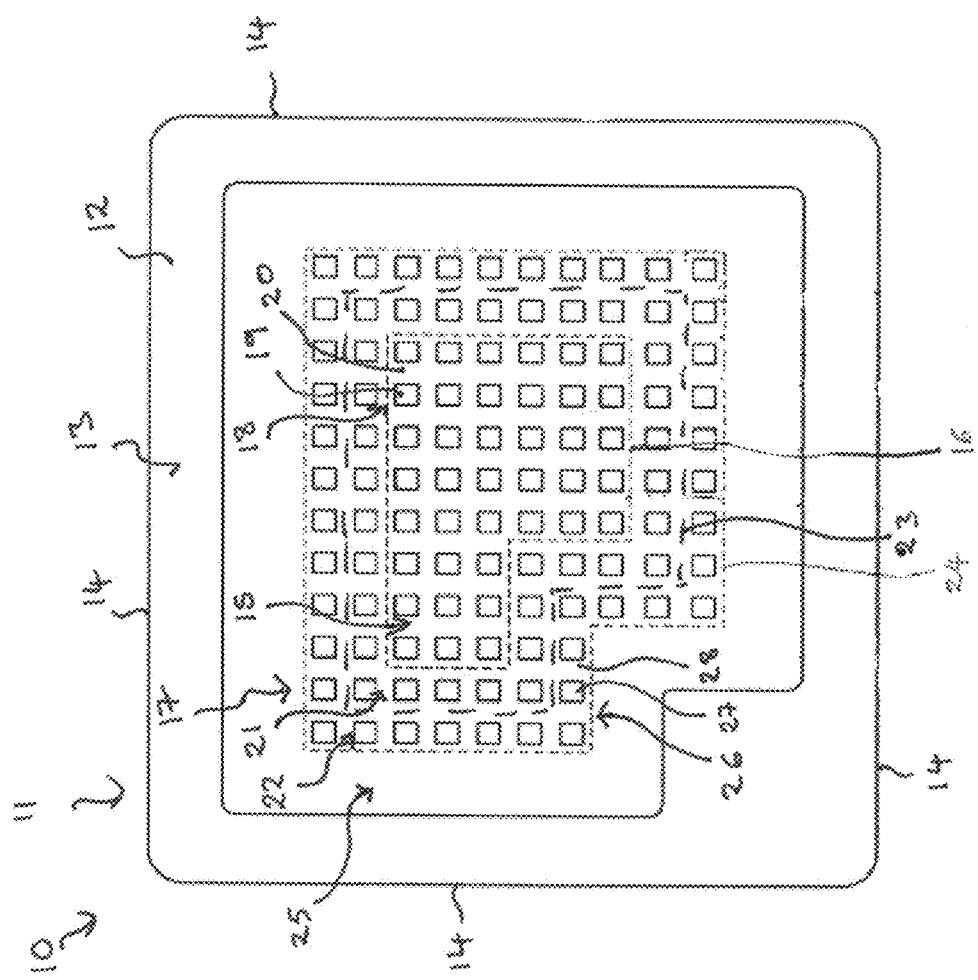
FIG. 1 illustrates a top view of a semiconductor device.

FIG. 1 illustrates a top view of a semiconductor device 10 which includes a transistor device 11. The transistor device 11 may be a vertical field effect transistor device based on a charge compensation principle. The semiconductor device 10 includes a semiconductor body 12 having a first surface 13, a second surface, which cannot be seen in the plan view of FIG. 1, that opposes the first surface, and side faces 14 extending between the first surface 13 and the second surface 32. The semiconductor body 12 may comprise silicon and may include a silicon epitaxial layer deposited on a substrate such as a single crystal silicon substrate.

The semiconductor device 10 includes an active area 15 which is denoted by the dashed line 16 in the plan view of FIG. 1. The active area 15 is laterally surrounded by an edge termination region 17. The edge termination region 17 laterally surrounds the active area 15 on all sides. The edge termination region 17 includes an edge termination structure for avoiding breakdown of the semiconductor device 10 at or near the first surface 13 and increasing the breakdown voltage of the semiconductor device 10. The edge termination structure may, for example, lower the field intensity junction by spreading the electric field lines across the edge termination region 17.

The active area 15 includes a plurality of active semiconductor cells 18. Each active transistor cell 18 comprises a columnar trench 19 which comprises a field plate, which is not illustrated in the plan view of FIG. 1, and a mesa 20. The columnar trenches 19 may be arranged in an array, such as a regular array, such as a regular grid, for example rows and columns, or may be arranged in an array of staggered or shifted rows, in which the columnar trenches 19 of each row have the same pitch or spacing in the long direction of the row and are offset in the long direction with respect to an immediately adjacent row of the array, or may be arranged in an array in which the columnar trenches have a regular pattern such as a hexagonal place packed arrangement. The lateral form of each of the columnar trenches 19 within the array having any form or pattern may be square, octagonal, round or hexagonal, for example. For example, the columnar trenches may have a lateral octagonal form in plan view and be arranged in staggered rows. The mesas 20 are formed by the regions of the semiconductor body 12 that are located between the columnar trenches 19. The mesas 20 include a drift region 29 of the first conductivity type.

The edge termination region 17 comprises a transition region 21 which laterally surrounds the active region 15 and an outer termination region 22 which laterally surrounds the transition region 21. The edge termination region 17 may further include an outer region 25 that laterally surrounds the outer termination region 22. The boundary between the transition region 21 and the outer termination region 22 is indicated by the dashed line 23 and the boundary between the outer termination region 22 and the outer region 25 is indicated by the dashed line 24 in the plan view of FIG. 1.

The transistor device 11 may be a vertical MOSFET device that comprises a field plate for charge compensation. The source and gate of the MOSFET device are positioned at the first surface 13 and the drain is positioned at the second opposing surface so that the drift path of the MOSFET device extends vertically and substantially perpendicular to the first surface 13 and the second surface 32. MOSFET devices with a field plate for charge compensation offer an improvement of the area-specific resistance. Some of these devices use a stripe design, i.e. the trenches and the mesas have an elongate strip form and are arranged alternatively so that a strip-like mesa is defined by two adjacent strip-like trenches. However, some types of designs of MOSFET devices with a field plate for charge compensation, such as those described herein, include columnar or needlelike trenches so that the mesa is formed by the material between the columnar trenches. A columnar trench is typically a deep trench containing the field-plate in the center that is surrounded by a separate shallower gate trench positioned in the mesa. This design results in a larger cross section of the mesa region which is expected to lead to a further reduction of the overall on-resistance.

The transition region 21 and the outer transition region 22 of the edge termination region 17 comprise a plurality of inactive cells 26. Each inactive cell comprises a columnar termination trench 27 and a termination mesa 28. The columnar termination trench 27 comprises a field plate which is not illustrated in the plan views of FIG. 1. The termination mesa 28 includes a drift region of a first conductivity type.

In some embodiments, the lateral shape, pattern and pitch (centre-to-centre spacing) of the columnar termination trenches 27 may be the same as that for the columnar trenches 19 of the active transistor cells 17 of the active region 15. The field plates in the columnar termination trenches 27 and in the columnar trenches 19 may be of the same size and shape.

In some embodiments, some or all of the termination mesas 28 are laterally smaller than the mesas 20 in the active region 15. This smaller width of the termination mesas 28 may be the result of the columnar termination trenches 27 having the same centre-to centre spacing or pitch, but each columnar termination trenches 27 being laterally wider than the columnar trenches 19 in the active region 15.

In some embodiments, the termination mesas 28 and columnar termination trenches 27 which are positioned laterally nearer to the active region 15 have the same width as the mesas 20 and columnar trenches 19, respectively, in the active area 15, whereas the termination mesas 28 which are positioned laterally more outwardly from the active area 15 are laterally smaller, e.g. narrower, than the mesas 20 in the active area 15 and the columnar termination trenches 27 which are positioned laterally more outwardly from the active area 15 have a greater lateral size, e.g. width, than the columnar trenches 19 in the active area 15.

In some embodiments, the doping level of the drift region 29 in the narrower termination mesas 28 is higher than the doping level of the drift region 29 in the mesas 20 in the active area 15 and in the wider termination mesas 28.

In some embodiments, the columnar termination trenches 27 and the columnar trenches 19 in the active region 15 have the same depth, i.e. have a base or bottom that is positioned at approximately the same distance from the first surface 13. In other embodiments, the columnar termination trenches 27 in the transition region 21 and outer transition region 22 have a greater depth than the columnar trenches 19 in the active region 15.

Figure 2:
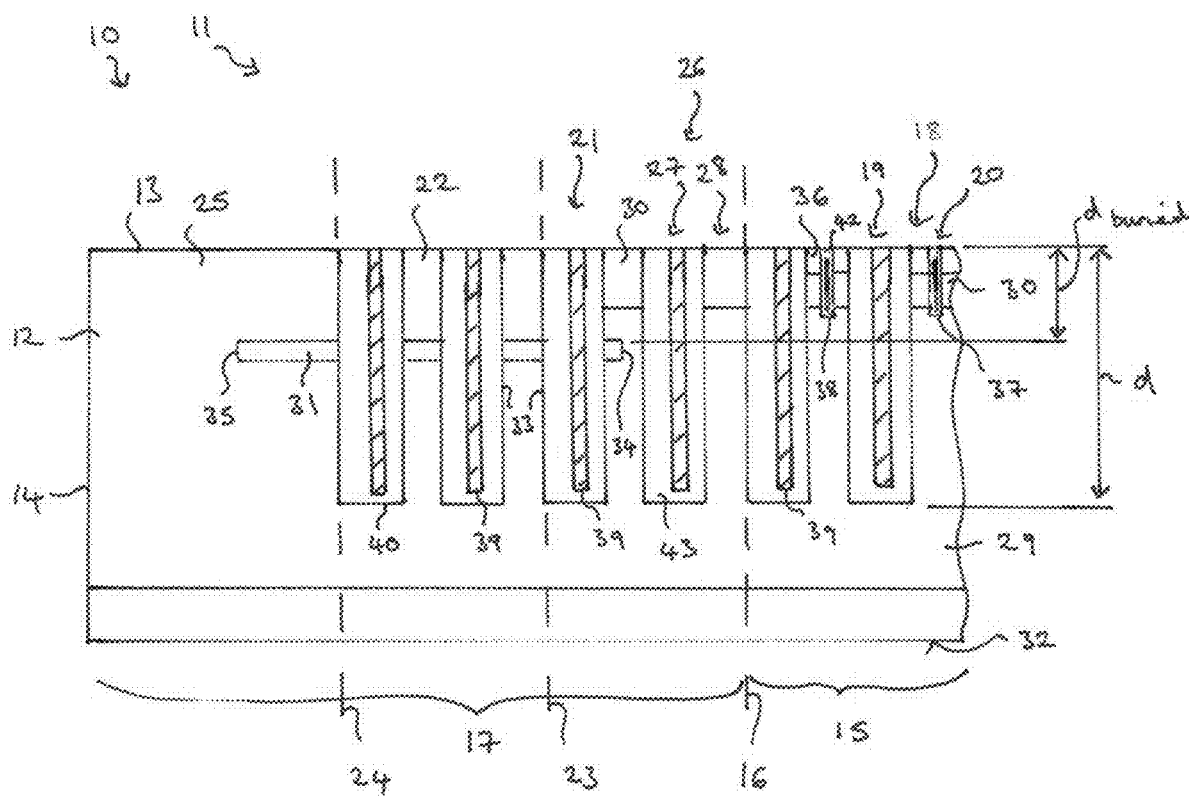
FIG. 2 illustrates a cross-sectional view of a portion of a semiconductor device.

FIGS. 2 and 3 illustrate respective cross-sectional views of a portion of the semiconductor device 10 and illustrate a portion of the active area 15 and the edge termination region 17 including the transition region 21, the termination region 22 and the outer region 25.

In the transition region 21, the termination mesa 28 comprises a body region 30 of a second conductivity type that is arranged on the drift region 29. In the transition region 21, the body region 30 extends to the first surface 13 of the semiconductor body 12 so that no source region is provided. These cells are, therefore, inactive.

The second conductivity type opposes the first conductivity type. For example, in some embodiments, the first conductivity type is n-type and the second conductivity type is p-type or vice versa.

In the outer termination region 22, the drift region 29 of the termination mesas 28 extends to the first surface 13 of the semiconductor body 12. The termination mesas 28 in the outer termination region 22, in contrast to the termination mesas 28 in the transition region 21, do not include a body region.

In the transition region 21 of the edge termination region 17, the termination mesa 28 includes a body region 30 of the second conductivity type that is arranged on the drift region 29. The body region 30 extends to the first major surface 13 of the semiconductor body 12 in the transition region 21. In the outer termination region 22 of the edge termination region 17, the drift region 29 extends to the first surface 13 in the termination mesas 28. Thus, the transition region 21 is distinguishable from the outer termination region 22 by the presence of the body region 30. The region of the semiconductor body 12 that is doped with the first conductivity type and provides the source region 36 is laterally smaller than the region of the semiconductor body that is doped with the second conductivity type and that forms the body region 30. The lateral extent of the body region 30, as defined by the outer edge of the body region 30, is less than the lateral extent of the drift region 29 and the first surface 13.

The outer termination region 25 that surrounds and, in particular, is contiguous with the outer termination region 22 is free of inactive cells. Therefore, the outer termination region 25 is free of columnar trenches and mesas. The outer termination region 25 may include semiconductor material of the first conductivity type.

The mesas 20 of the active cells 18, the termination mesas 28 of the inactive cells 26 of the transition region 21 and of outer termination region 22 of the edge termination region 17 include the drift region 29 comprising a first conductivity type. The drift region 29 and the outer termination region 25 may be formed from an epitaxial silicon layer.

The edge termination region 17 further comprises a buried doped region 31. The buried doped region 31 has a lateral extent such that it is positioned in both the transition region 21 and the outer termination 22 of the edge termination region 17. The buried doped region 31 comprises the second conductivity type. The buried doped region 31 extends between and forms a portion of the sidewalls 33 of at least some of the columnar termination trenches 27.

The buried doped region 31 is positioned within the semiconductor body 12 at a distance from the first major surface 13 and has the form of a single doped region. The buried doped region 31 may have a substantially uniform thickness. The buried doped layer 31 may have the form of a plate-like layer that is bounded above and below by portions of the drift region 29 and that is spaced apart from the first major surface 13 and from the second major surface. This plate-like buried doped layer may also have a uniform thickness. In some embodiments, the buried doped layer 31 may be spaced apart from the body region 30 by a portion of the drift region 29.

In some embodiments, a portion of the buried doped layer 31 is spaced apart from the body region 30 by a portion of the drift region 29 and vertically overlaps a portion of the body region 30.

The lateral extent of the buried doped layer 31 may be defined by an inner edge 34 and an outer edge 35. In some embodiments, the buried doped region 31 comprises an inner edge 34 that is positioned in the transition region 21 of the edge termination region 17 and is positioned under the body region 30 of the termination mesa 28. The buried doped region 31 is vertically spaced apart from the body region 30 of the termination mesa 28 by a portion of the drift region 29. In some embodiments, the inner edge of the buried doped region 31 may be arranged such that the buried doped region 31 is positioned underneath the body region 30 that is positioned in two or more neighbouring termination mesas 28.

In at least some of the transition region 21, the body region 30 does not vertically overlap with the buried doped region 31. In particular, the portion of the body region 30 that is laterally positioned nearer to the active area 15 does not vertically overlap with the buried doped region 31. The inner edge 34 of the buried doped region 21 is laterally spaced apart from the active area 15 by at least one inactive cell 26 including a columnar termination trench 27 and termination mesa 28. In some embodiments, one or more termination mesas 28, which are laterally contiguous to the active region 15, have a structure such that the drift region 29 extends without interruption to the body region 30 and are free of the buried doped region 31.

In some embodiments, such as that illustrated in FIG. 3, the buried doped region 31 has an outer edge 35 that is positioned in the outer region 25 of the edge termination region 17 so that the buried doped region 31 extends from within the transition region 21, over the entire width of the intermediately situated outer transition region 22 and into the outer termination region 25 which is free of inactive cells. The outer edge 35 of the buried doped region 31 is positioned laterally between the side face 14 of the semiconductor body 12 and the plurality of inactive cells 26.

The columnar trenches 17 arranged in the active area 15 and the columnar termination trenches 27 arranged in the edge termination region 17 extend from the first surface 13 into the semiconductor body 12 by a distance d such that the columnar trenches 17, 27 have a base or bottom positioned at a depth d from the first surface 13. The buried doped region 31 is, in some embodiments, positioned at a depth from the first surface, wherein $0.6\ \mu m \leq d_{buried} \leq 2.0\ \mu m$.

The buried doped region 31 may have the form of a continuous ring when viewed from above that is positioned laterally adjacent all sides of the active area 15 and continuously laterally surrounds the active area. In some embodiments, the buried doped region 31 is fully depletable.

The doped buried region 31 may have the form of a layer having substantially uniform thickness. In some embodiments, the upper boundary of the buried doped region 31 is positioned at a depth from the first surface and the lower boundary of the buried doped region 31 is positioned at a depth $d_{2buried}$ from the first surface, whereby $d_{2buried} > d_{1buried}$ and $(d_{1buried} - d_{2buried})$ is around 200 nm to 800 nm.

The buried doped region 31 forms a portion of the sidewalls of at least two laterally adjacent rows of columnar termination 27 trenches, whereby one row is positioned in the transition region 21 and the other row is positioned in the outer termination region 22, since the buried doped region 31 has a lateral extent such that it is positioned in both the transition region 21 and in the outer termination region 22 of the edge termination region 17.

The active transistor cells 18 may have various transistor structures. In some embodiments, each mesa 20 of the active transistor cells 18 comprises the drift region 29 of the first conductivity type, a body region 30 of the second conductivity type which is arranged on the drift region 29 and a source region 36 of the first conductivity type which is arranged on the body region 30. Each of the columnar trenches 19 of the active transistor cells 18 extends from the first surface 13 through the source region 36 the body region 30 and into the drift region 29.

Each mesa 20 of the active transistor cells 18 also includes a gate trench 37 comprising a gate electrode 38. The gate electrode 38 is electrically insulated from the mesa 20 by an insulating layer 42 which lines the side walls and base of the gate trench 37. The gate trench 37 extends through the source region 36 and the body region 30 to the drift region 29. The depth of the columnar trenches 19 from the first surface 13 is greater than the depth of the gate trench 37 from the first surface 13.

The columnar trenches 19 of the active transistor cells 18 and the columnar termination trenches 27 of the edge termination region 17 each include a field plate 39 which is positioned towards the bottom of the columnar trench 19, 27, respectively. The field plate 39 is electrically insulated from the semiconductor body by an electrically insulative layer 43 which lines the sidewalls 33 and base 40 of the columnar trenches 19, 27.

In some embodiments, the edge termination region 17 further includes an inner transition region 47 that is formed at the boundary between the transition region 21 and the active region 15. This inner transition region 47 includes one or more rows of inactive cells 26' having a columnar termination trench 27' and a termination mesa 28'. The termination mesa 28' and associated columnar termination trench 27' has a body region 30 and does not have a source region so that the body region extends to and form the first surface 13. The columnar termination trenches 27' in this inner transition region 47 are distinguished from the columnar termination trenches 27 of the transition region 21 by a body contact 48. The body contact 48 positioned in the columnar termination trench 27' is used to electrically couple the body region 30 to source potential.

The various regions of the semiconductor device 10 can be distinguished by the connections to the trenches. In the active area 15, the trenches 19 and associated mesa 20 includes a body region 30, a source region 36 on the body region. In the inner transition region 47, columnar termination trenches 27' and their associated termination mesa 28' have a body region 30, a body contact 48 and no source region. In the transition region 21, the columnar termination trenches 27 and associated termination mesa 28 have a body region 30, no body contact and no source region. In the outer transition region 22, the columnar termination trenches 27 and associated termination mesa 28 have no body region, no body contact and no source region.

The buried doped region 31 is used to in order to enable a high doping of the mesa epi and to realize a lowest-possible area-specific on-resistance. In some embodiments, the buried doped region 31 extends in the area of the edge termination trenches 28 of the edge termination region 17 and from within the transition region 21, through the outer termination region 22 and into the outer region 25.

In some embodiments, this additional buried doped region 31 has the following combination of properties: it is fully depletable in order to locally relax the electric field, it laterally extends under the outer end of the body region 30 in the transition region 21 in order to avoid an early breakdown at the curvature at the end of the body region 30 and it extends laterally towards the side faces 14 of the semiconductor body 12 into the outer termination region 25, which includes no columnar trenches with field plates, in order to 'stretch' the potential lines at the outer side of the termination structure and to relax the electric field at the laterally outermost trench 27 of the edge termination region 17 so as to avoid an early breakdown at this location.

FIG. 4 illustrates a top view of a portion of the semiconductor device 10 of FIG. 3 and illustrates a portion of the active region 15, the transition region 21, the outer transition region 22 and outer termination region 25. FIG. 4 also illustrates the metallisation structures which are electrically connected to the source region 36 of the active transistor cells 18 and the gate electrodes 38 of the active transistor cells 18.

In the plan view of FIG. 4, eight edge termination trenches 27 are illustrated. However, the design is not, limited to eight termination trenches and may ever, include more than or fewer than nine trenches. In practice, fewer than eight trenches are required in order to provide beneficial effects.

FIG. 4 illustrates that the semiconductor device 10 further includes a gate runner 41 positioned on the first surface 13 in the outer region 25 of the semiconductor device 10 and at least one gate finger 40. The gate finger 40 and the gate runner may comprise a metal. The gate runner 41 may be positioned laterally between and spaced apart from the side face 14 of the semiconductor body 12 and the outer edge 35 of the buried doped region 31. The gate fingers 40 extend from the gate runner, over the edge termination region 17 to a position within the transition region 21 where it is electrically coupled to the gate electrode 38 by a groove contact 44.

Source fingers 45, which are electrically coupled to the source regions 31 of the active transistor cells 18, are arranged alternately with the gate fingers 40. The gate contact 44, which may have the form of a groove, extends from the gate finger 40 which is electrically coupled to the gate electrodes 38 of active transition transistor cells 17. The gate contact 44 may be positioned above the body region 30 in the transition region 21. One or more insulation layers 46 are arranged on the body region 30 between the body region 30 and the gate finger 40.

The body region 30 of the semiconductor device 10 is arranged to extend from the active area 15 into the transition region 21 of the termination structure 17. This arrangement enables the contact from the gate finger 40 to the gate trench grid to be realized outside of the active area 15. The lateral width of the transition region 21, which is inactive as there is no source is present in the termination mesas 28, can be used to provide a minimum distance between the edge of the source region 36 within the active region 15 and the edge of the overlying source metal layer and a large enough distance to hinder potentially hazardous ion drifts from the metal edge into the active region. As such the width of this transition region 21 between the boundary 23 and 24 is not determined by the blocking capability of the edge termination structure.

FIG. 5 illustrates the electrostatic potential simulated for the structure illustrated in FIG. 3. The highest potential remains spaced apart from the base of the trenches 19 in the active cells 18 and from the surface near the outermost columnar trench 27' of the edge termination structure.

The depletable additional buried doped region 31 is able to locally relax the electric field. As it laterally extends under the outer end 50 of the body region 30 in the transition region 21, an early breakdown at the curvature at the end 50 of the body region 30 is avoided. As it extends laterally towards the side faces of the semiconductor body 12 into the outer region 25 which includes no columnar trenches with field elates, the potential is laterally stretched at the outer side of the termination structure and reduced at the laterally outermost trench 27' of the edge termination region so as to avoid an early breakdown at this location in particular at the surface of the semiconductor body 12 at the laterally outermost trench 27' of the edge termination region.

FIG. 6 illustrates the impact ionization simulated for the structure illustrated in FIG. 3. FIG. 6 illustrates that a breakdown location in the inactive transistor cells which are without a body contact are avoided, thus demonstrating that the edge termination structure including the buried doped layer 31 as described herein has the desired effect of avoiding breakdown at the surface in the edge termination region.

To summarize, an edge termination structure for charge-compensated power MOSFET devices using field-plates in needle-shaped trenches is provided that includes a depletable buried doped region, for example, a buried p-doped region in the edge termination region. The depletable buried doped region extends laterally under the end of the body region at one side and extends further than the outermost edge termination trench on the other side. The buried doped region is spaced apart from the body region by a portion of the drift region. The vertical overlap between the buried doped region and the body region at one end of the buried doped region and the extension of the buried doped region beyond the outermost edge termination trench provides an edge termination structure that is more insensitive to any surface charges which might be introduced later (as, for example, during assembly) which enhances the robustness and reliability of the device. Therefore, any reduction of the surface doping level in the edge termination region and outside of it is avoided and the sensitivity is significantly reduced to any surface charges which might be introduced.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body having a first surface, a second surface opposing the first surface, and side faces;
an active area comprising a plurality of active transistor cells, each active transistor cell comprising a mesa and a columnar trench comprising a field plate; and
an edge termination region laterally surrounding the active area and comprising a plurality of inactive cells, each inactive cell comprising a columnar termination trench comprising a field plate and a termination mesa comprising a drift region of a first conductivity type,
wherein the edge termination region further comprises a transition region laterally surrounding the active region and an outer termination region laterally surrounding the transition region,
wherein in the transition region, the termination mesa comprises a body region of a second conductivity type arranged on the drift region and in the outer termination region the drift region of the termination mesa extends to the first surface,
wherein the edge termination region further comprises a buried doped region having a lateral extent such that the buried doped region is positioned in the transition region and in the outer termination region.

2. The semiconductor device of claim 1, wherein the buried doped region comprises an inner edge positioned under the body region in the transition region.

3. The semiconductor device of claim 1, wherein the edge termination region further comprises an outer region that is free of inactive cells and that laterally surrounds the outer termination region.

4. The semiconductor device of claim 3, wherein the buried doped region has an outer edge that is positioned in the outer region.

5. The semiconductor device of claim 4, wherein the outer edge is positioned laterally between the side faces of the semiconductor body and the plurality of inactive cells.

6. The semiconductor device of claim 1, wherein the buried doped region has the second conductivity type.

7. The semiconductor device of claim 1, wherein the buried doped region is fully depletable.

8. The semiconductor device of claim 1, wherein in the transition region, the buried doped region is vertically spaced apart from the body region of the termination mesa by a portion of the drift region.

9. The semiconductor device of claim 1, wherein the columnar trenches have a base positioned at a depth d from the first surface and the buried doped region is positioned at a depth $d_{buried}$ from the first surface, and wherein 0.6 µm≤$d_{buried}$≤2.0 µm.

10. The semiconductor device of claim 1, wherein in the transition region, the body region of the termination mesas extends to the first surface.

11. The semiconductor device of claim 1, wherein the buried doped region forms a portion of side walls of at least two rows of columnar termination trenches.

12. The semiconductor device of claim 1, wherein each mesa of the active transistor cells comprises a drift region of the first conductivity type, a body region of the second conductivity type arranged on the drift region, a source region of the first conductivity type arranged on the body region, and a gate trench comprising a gate electrode and that extends through the source region and the body region into the drift region, and wherein each of the columnar trenches extends from the first surface through the body region and into the drift region.

13. The semiconductor device of claim 12, wherein the gate trenches have a strip or stripe form.

14. The semiconductor device of claim 1, further comprising at least one gate finger extending over the edge termination region to a gate runner that is positioned laterally between the side faces of the semiconductor body and the columnar termination trenches of the outer termination region.

15. The semiconductor device of claim 14, wherein the gate runner is positioned laterally between the side faces and an outer edge of the buried doped region.

16. The semiconductor device of claim 14, further comprising a gate contact electrically coupling the gate runner to gate electrodes of the active transistor cells, and wherein the gate contact is positioned above the body region in the transition region.

17. The semiconductor device of claim 1, wherein the semiconductor device is a vertical transistor device.

18. The semiconductor device of claim 1, wherein the mesas of the active transistor cells are formed by material of the semiconductor body between the columnar trenches.

19. The semiconductor device of claim 1, wherein a lateral shape, pattern and center-to-center spacing of the columnar termination trenches of the inactive cells are the same as that for the columnar trenches of the active transistor cells.

20. The semiconductor device of claim 1, wherein the field plates in the columnar termination trenches and in the columnar trenches are of a same size and shape.

* * * * *